United States Patent
Koike (10) Patent No.: US 6,303,983 B1
(45) Date of Patent: *Oct. 16, 2001

(54) APPARATUS FOR MANUFACTURING RESIN-ENCAPSULATED SEMICONDUCTOR DEVICES

(75) Inventor: Masahiro Koike, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/300,684

(22) Filed: Apr. 27, 1999

(30) Foreign Application Priority Data

May 1, 1998 (JP) .................................................. 10-121987

(51) Int. Cl.$^7$ ........................... H01L 23/50; H01L 21/56; H01L 29/44
(52) U.S. Cl. ........................ 257/670; 257/673; 257/788; 257/787; 257/790; 257/666; 257/920; 257/713; 257/775; 438/414; 438/942; 438/946
(58) Field of Search ................................... 257/670, 666, 257/673, 674, 676, 787, 788, 790, 920, 773, 775; 438/414, 946, 942

(56) References Cited

U.S. PATENT DOCUMENTS

| | | | |
|---|---|---|---|
| 4,942,454 | * | 7/1990 | Mori et al. ............................. 257/676 |
| 5,619,065 | * | 4/1997 | Kim ...................................... 257/673 |
| 5,767,527 | * | 6/1998 | Yoneda et al. ......................... 257/48 |
| 5,874,783 | * | 2/1999 | Yamada ................................. 257/778 |
| 5,909,053 | * | 6/1999 | Fukase et al. ......................... 257/666 |
| 5,929,511 | * | 7/1999 | Nakazawa et al. ................... 257/666 |
| 5,945,731 | * | 8/1999 | Iino ...................................... 257/672 |
| 5,955,778 | * | 9/1999 | Shingai ................................. 257/666 |

FOREIGN PATENT DOCUMENTS

| | | | |
|---|---|---|---|
| S63-96947 | 4/1988 | (JP) | ............................. H01L/23/50 |
| S63-180119 | 11/1988 | (JP) | ............................. B21D/28/32 |
| H7-22447 | 1/1995 | (JP) | ............................. H01L/21/56 |
| 9-153504 | 6/1997 | (JP) | ............................. H01L/21/56 |
| H9-312368 | 12/1997 | (JP) | ............................. H01L/23/50 |

* cited by examiner

Primary Examiner—Alexander O. Williams
(74) Attorney, Agent, or Firm—Hayes, Soloway, Hennessey, Grossman & Hage, P.C.

(57) ABSTRACT

A semiconductor device includes a lead frame, a semiconductor chip, a resin-encapsulated portion, and tie bars. The semiconductor chip is mounted on a die pad of the lead frame. The resin-encapsulated portion resin-encapsulates the semiconductor chip. The tie bars are provided to outer lead portions of the lead frame to prevent resin leakage during resin encapsulation, and are cut and removed in a finishing step of resin encapsulation. A plating surface is formed on a sectional surface of each of the tie bars. A semiconductor device manufacturing method and apparatus are also disclosed.

4 Claims, 8 Drawing Sheets

APPARATUS FOR MANUFACTURING RESIN-ENCAPSULATED SEMICONDUCTOR DEVICES

BACKGROUND OF THE INVENTION

The present invention relates to a resin-encapsulated semiconductor device such as a molded flat package, and a semiconductor device manufacturing method and apparatus.

Figure 7A:
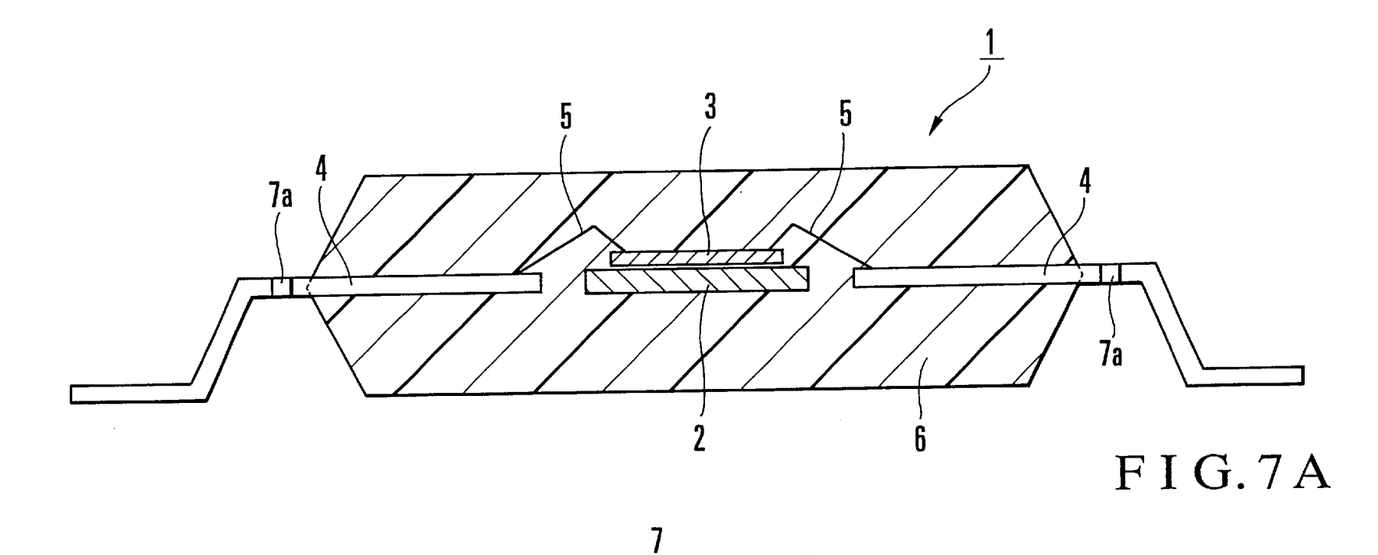
FIG. 7A is a sectional view of the main part of a conventional resin-encapsulated semiconductor device.

A conventional resin-encapsulated semiconductor device of this type has an arrangement as shown in FIG. 7A. This will be described in brief. This resin-encapsulated semiconductor device 1 has a semiconductor chip 3 mounted on a die pad 2, and a large number of leads 4 disposed around the die pad 2. The semiconductor chip 3 and the inner lead portions of the respective leads 4 are connected to each other through thin metal wires 5 bonded to them and formed of Au wires or the like.

The die pad 2, the semiconductor chip 3, and the inner lead portions of the leads 4 described above are encapsulated with a molding resin to form a resin-encapsulated portion 6. Hence, the package type semiconductor device 1 is formed.

The outer lead portions of the respective leads 4 are bent into required shapes.

Figure 7B:
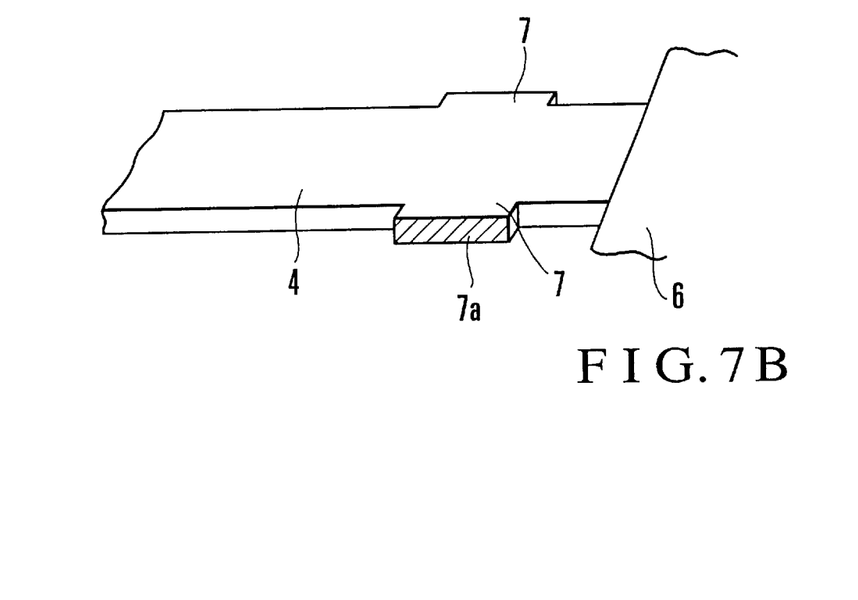
FIG. 7B is an enlarged perspective view of part of the same.

Resin-encapsulated semiconductor devices 1 of this type are manufactured by using a large number of die pads 2 and a lead frame (not shown) formed around the die pads 2 to have portions that form the leads 4. Of the lead frame forming portions of this lead frame, portions of the outer lead portions corresponding to extending portions of the resin-encapsulated portion 6 form tie bars 7 for preventing resin leakage during resin encapsulation. These tie bars 7 are cut in a finishing step after a resin encapsulating step, thus forming tie bar sectional surfaces 7a as shown in FIG. 7B.

The manufacturing process for these conventional resin-encapsulated semiconductor devices 1 includes a mounting bonding step, a resin molding step, a runner/gate removing step, a thermal aging step, a trimming and plating step, a tie bar cutting step, a lead cutting, forming, marking, and cutting/separating step, and a screening step.

Figure 8A:
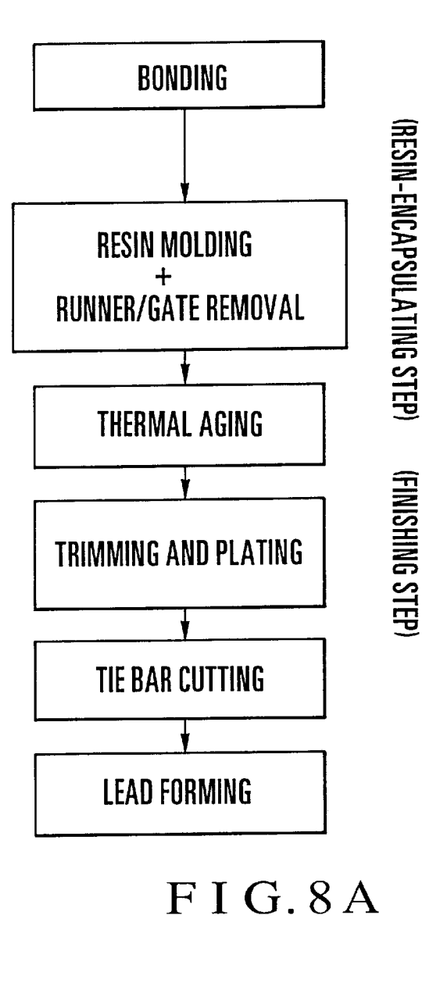
FIG. 8A is a flow chart showing a conventional semiconductor device manufacturing method.
Figure 8B:
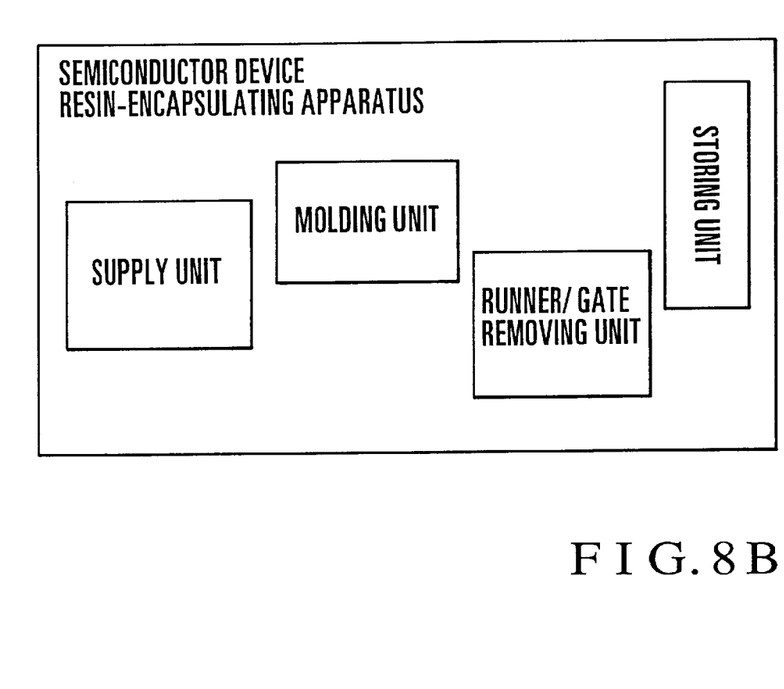
FIG. 8B is a block diagram briefly showing a conventional semiconductor device resin-encapsulating apparatus.

In a semiconductor device resin-encapsulating apparatus which performs the resin encapsulating step of the manufacturing process described above, as shown in FIGS. 8A and 8B, a structure obtained by connecting the semiconductor chip 3 mounted on the die pad 2 of a lead frame and the leads 4 of the lead frame to each other by bonding is prepared at a supply unit.

This structure is conveyed from the supply unit to a molding unit, and is resin-molded by the molding unit, to encapsulate the semiconductor chip 3 portion with a resin.

The semiconductor device resin-encapsulated by the molding unit is conveyed to a runner/gate removing unit that removes a runner and gates formed during resin encapsulation. After its runner and gates are removed, the semiconductor device is stored in a storing unit.

After that, the process advances to the finishing step of the resin-encapsulating step. After thermal aging, trimming, and plating are performed, the process advances to the tie bar cutting step to cut tie bars. Lead bending is also performed.

In the tie bar cutting step described above, the tie bars are cut, and simultaneously a resin dammed by the tie bars (to be referred to as a not required by the tie bars hereinafter) is also removed.

In the conventional semiconductor device resin-encapsulating apparatus described above, although the runner/gate removing unit is provided, a tie bar cutting/removing unit is not provided. Accordingly, the tie bars must be removed by a separate apparatus.

With the conventional semiconductor device resin-encapsulating apparatus described above, since tie bar cutting (including removal of the resin not required by the tie bars) is performed after trimming and plating, the semiconductor device undergoes the lead forming, cutting, marking, and cutting/separating step and then the screening step described above while the removed resin scrap and metal scrap attach to the package. The following inconveniences arise.

More specifically, the scrap generated during tie bar cutting and removal as described above may induce punching marks on the surfaces of the leads during, e.g., forming the leads, to result in defective leads. In the process described above, a lead cutting failure, a marking failure, and a screening failure (a situation wherein a product that should be particularly nondefective causes an adhesion failure due to the attaching scrap described above and is undesirably determined as a defective product) are caused to decrease the yield.

It is cumbersome to screen a shape failure caused by small damages formed by such resin scrap and metal scrap. A semiconductor device which cannot be screened as one having an outer appearance failure may be shipped as a nondefective product.

SUMMARY OF THE INVENTION

The present invention has been made in view of the above situation, and has as its object to provide a semiconductor device in which trimmed scrap formed of resin scrap or metal scrap generated in the tie bar cutting step of the finishing step after the resin-encapsulating step for a resin-encapsulated semiconductor device causes no trouble in the following manufacturing steps, and a method and apparatus for manufacturing this semiconductor device.

In order to achieve the above object, according to the present invention, there is provided a semiconductor device comprising a lead frame, a semiconductor chip mounted on a die pad of the lead frame, a resin-encapsulated portion for resin-encapsulating the semiconductor chip, and tie bars which are provided to outer lead portions of the lead frame to prevent resin leakage during resin encapsulation and which are cut and removed in a finishing step of resin encapsulation, wherein a plating surface is formed on a sectional surface of each of the tie bars.

DESCRIPTION OF THE PREFERRED EMBODIMENT

FIGS. 1 to 6 show a semiconductor device and a method of manufacturing the same according to an embodiment of the present invention.

Figure 1:
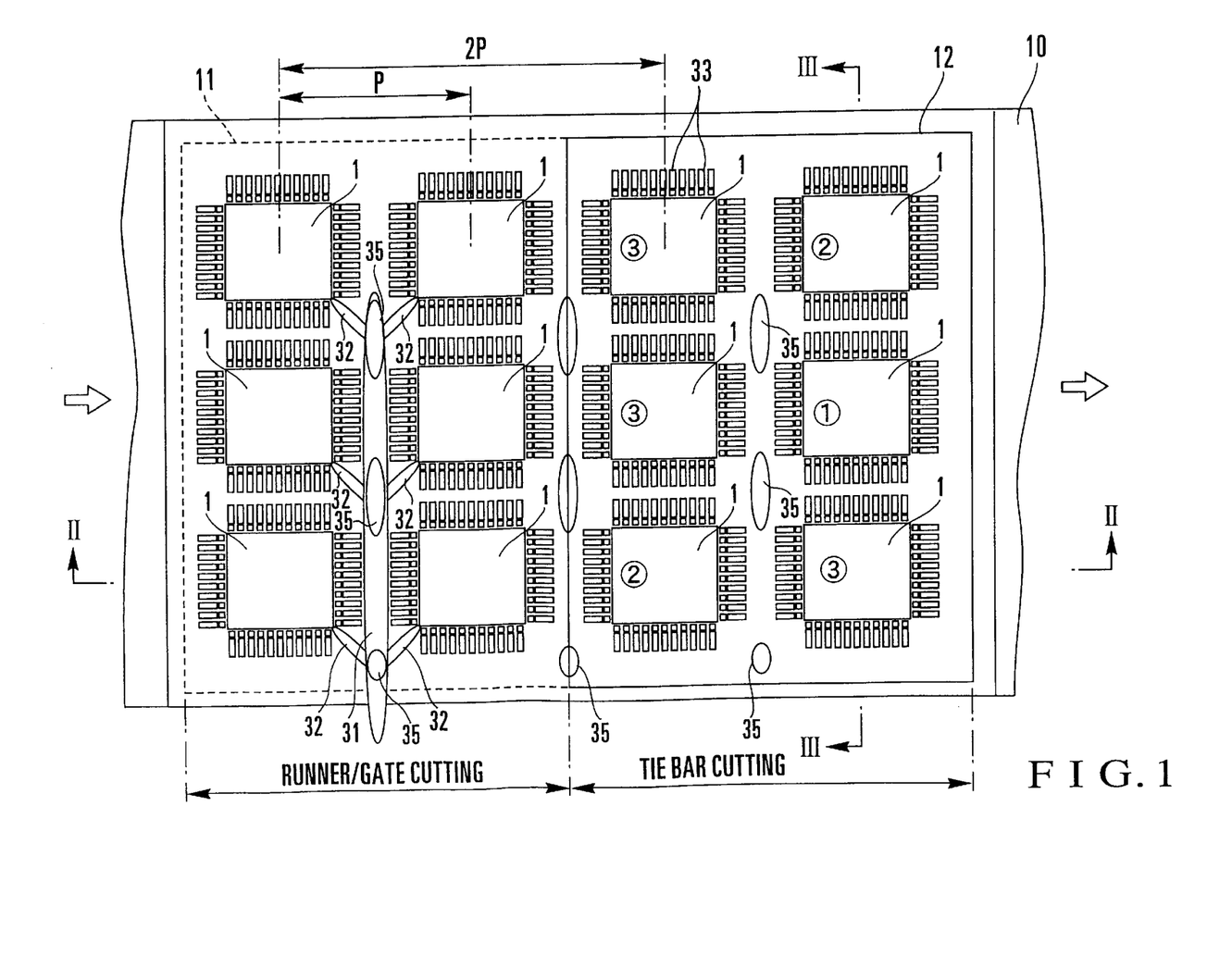
FIG. 1 is a plan view of resin-encapsulated semicondutor devices aligned on a lead frame to show a semiconductor device and a semiconductor device manufacturing method and apparatus according to an embodiment of the present invention.
Figure 2:
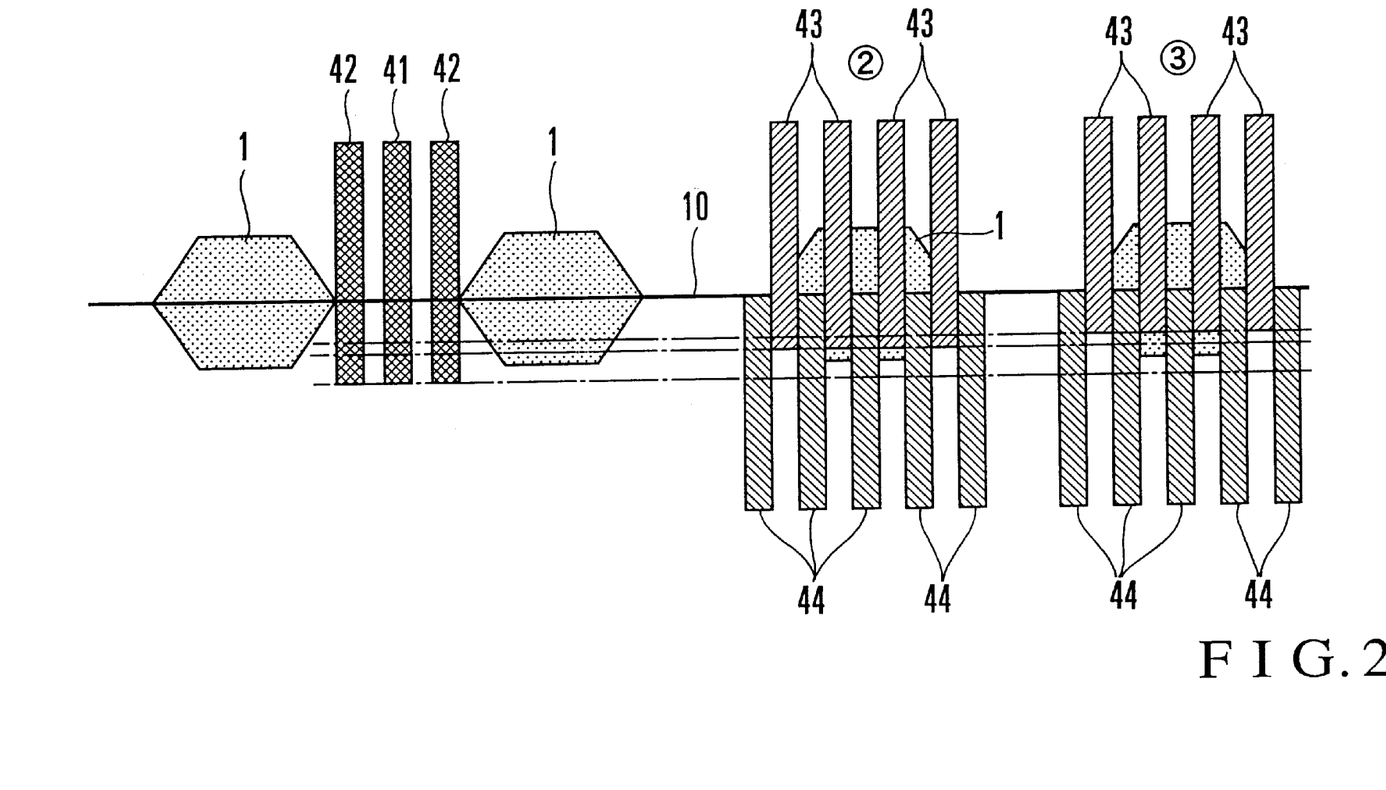
FIG. 2 is a sectional view taken along the line II—II of FIG. 1.
Figure 3:
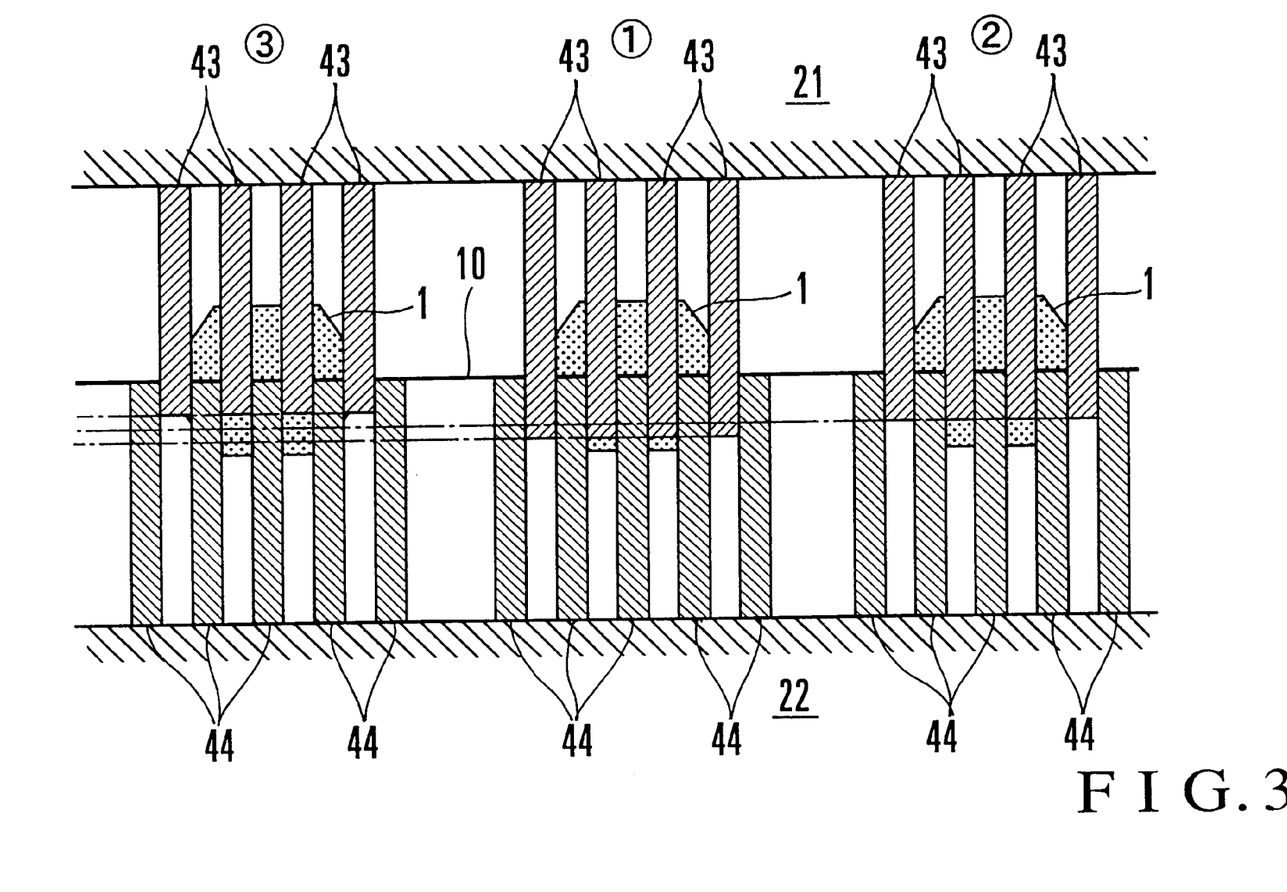
FIG. 3 is a sectional view taken along the line III—III of FIG. 1.
Figure 4A:
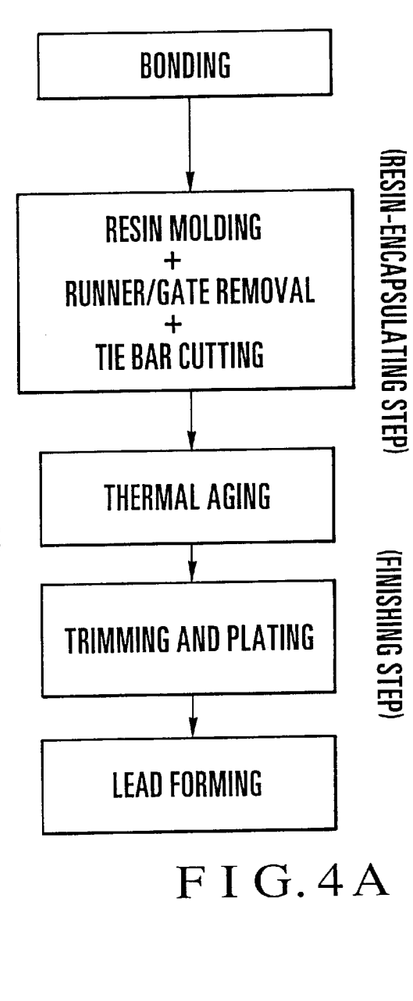
FIG. 4A is a flow chart showing a semiconductor device manufacturing method according to the present invention.
Figure 4B:
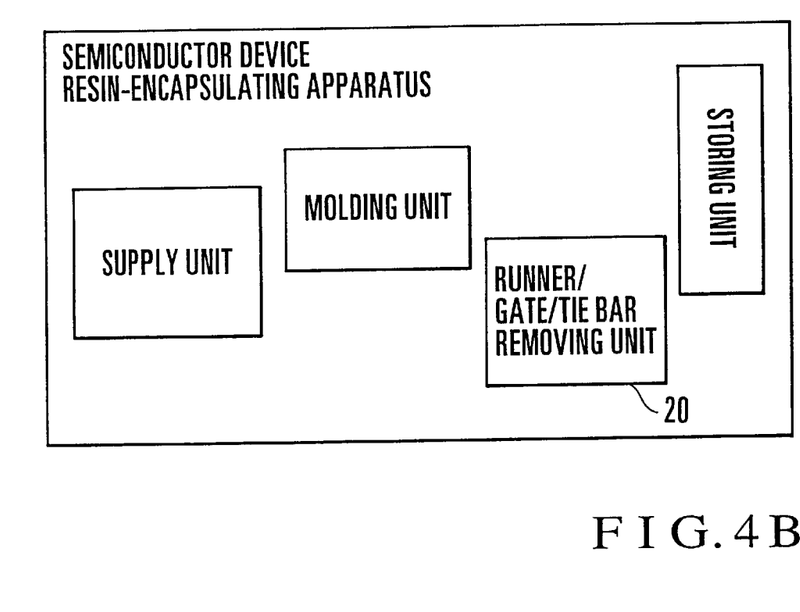
FIG. 4B is a block diagram schematically showing a semiconductor device resin-encapsulating apparatus.

Referring to FIGS. 1 to 3, a plurality of resin-encapsulated semiconductor devices 1 are formed on a lead frame 10. The three semiconductor devices 1 are aligned in each column, i.e., in the widthwise direction on the lead frame 10.

In this embodiment, a case will be described wherein two columns each consisting of the three resin-encapsulated semiconductor devices 1 described above form one stage and two stages (3 devices×4 columns) are processed as one group.

These resin-encapsulated semiconductor devices 1 are manufactured in the following manner. Semiconductor chips (not shown) are mounted on the die pads (formed on portions corresponding to the semiconductor devices 1, although not shown in FIG. 1) of the lead frame 10 described above. The chips and the inner lead portions (not shown) of leads 4 formed of belt-like portions defined by slits around the semiconductor devices 1 are connected to each other with thin metal wires. After that, the resultant structure is encapsulated with a resin by the molding unit of a semiconductor device resin-encapsulating apparatus shown in FIG. 4B.

The lead frame 10, on which the semiconductor devices 1 are aligned as the resin-encapsulated packages, is conveyed in a state shown in FIG. 1 to a runner/gate/tie-bar removing unit 20.

According to the present invention, immediately after the resin-encapsulated semiconductor devices 1 are molded with the resin, the runner/gate/tie-bar removing unit 20 cuts tie bars 33 of the outer lead portions and simultaneously removes runners 31 and gates 32 formed during resin encapsulation.

Figure 5:
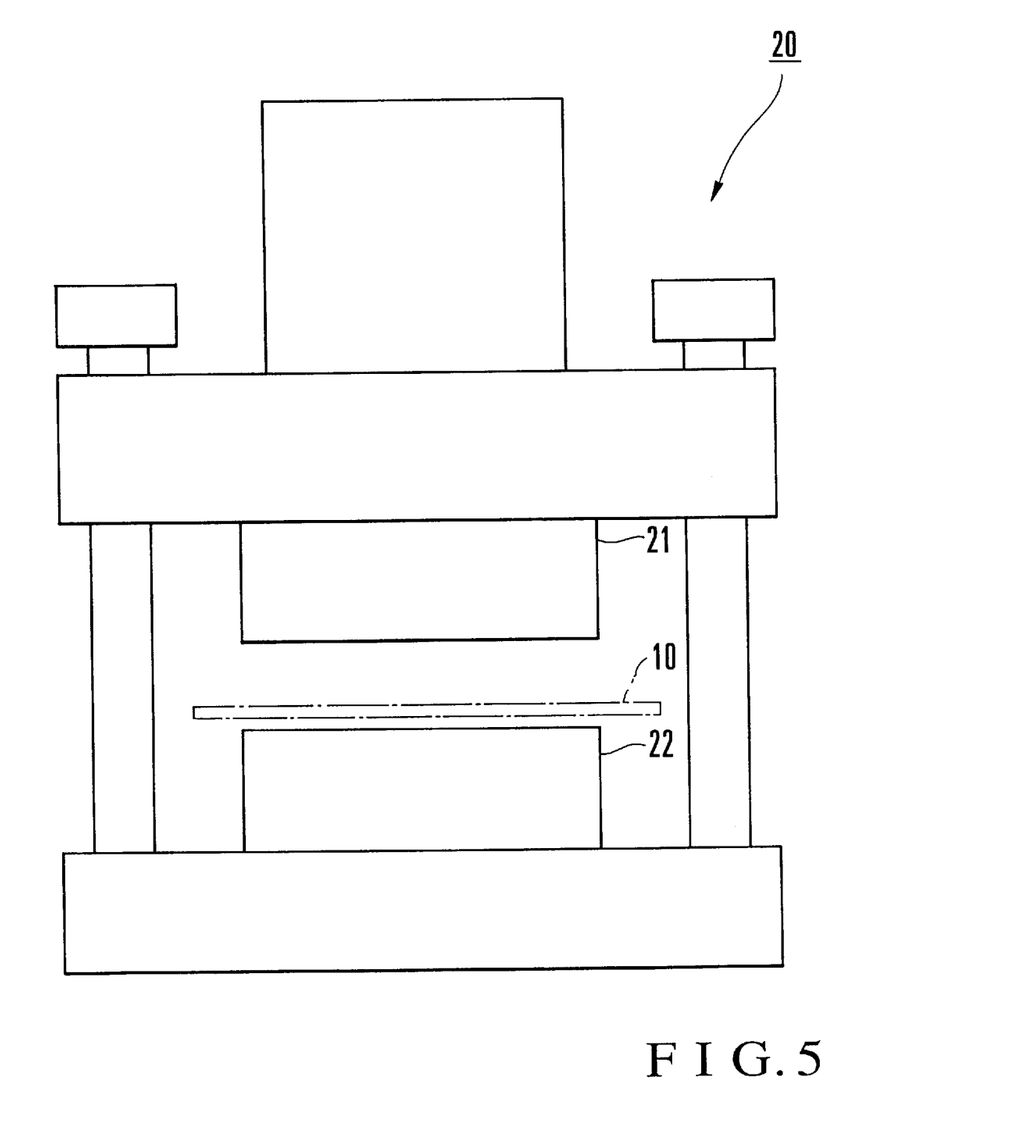
FIG. 5 is a side view briefly explaining a semiconductor device manufacturing apparatus according to the present invention.

The runner/gate/tie-bar removing unit 20 has a press mold consisting of a pair of upper and lower molds 21 and 22, as shown in FIG. 5. The resin-encapsulated lead frame 10 is sequentially conveyed to a position between the upper and lower molds 21 and 22, as shown in FIG. 1, to remove its runners and gates and to cut and remove its tie bars. The practical structure of the runner/gate/tie-bar removing unit 20 is widely known, and a detailed description thereof will accordingly be omitted.

Removal of the runners 31 and gates 32 and removal of the tie bars 33 (including removal of the resin described above not required by the tie bars) by the runner/gate/tie-bar removing unit 20 described above are performed in the following manner.

In this embodiment, 12 (=3 devices×4 columns) semiconductor devices 1 aligned on the lead frame 10 are positioned between the upper and lower molds 21 and 22 described above. A runner punch 41, gate punches 42, tie bar punches 43, and tie bar dies 44 provided to one upper mold 21 and one Lower mold 22 that oppose each other, as shown in FIGS. 2 and 3, remove, of the six semiconductor devices 1 as a set, the runner 31 and gates 32 on the left side in FIG. 1 and the tie bars 33 on the right side in FIG. 1, by one stroke.

In this embodiment, six semiconductor devices 1 are processed at once in resin encapsulation. One runner 31 is formed between two sets each including the three semiconductor devices 1. Six gates 32 extend from the runner 31 to be connected to the corresponding semiconductor devices 1.

Runner/gate removal described above is to remove the one runner 31 and the six gates 32 described above by punching with the runner punch 41 and gate punches 42, respectively. Holes 35 or the like used as punch insertion or guide holes are formed in the lead frame 10 to correspond to the punches 41 and 42.

Referring to FIG. 1, a runner/gate removing portion 11 corresponds to the left half of the press mold (upper mold 21) that removes the runner and gates of the two columns each consisting of the three semiconductor devices 1 on the lead frame 10. A tie bar removing portion 12 corresponds to the right half of the press mold (upper mold 21) that cuts the tie bars of the two columns each consisting of the three semiconductor devices 1 on the lead frame 10. The punches 41 and 42, and the tie bar punches 43 are formed on the runner/gate removing portion 11 and the tie bar removing portion 12, respectively, in a state to be described later. Although not shown in FIGS. 1 to 3 described above, dies are formed on the lower mold 22 corresponding to the punches 42 that remove the gates 32, as a matter of course.

Figure 6:
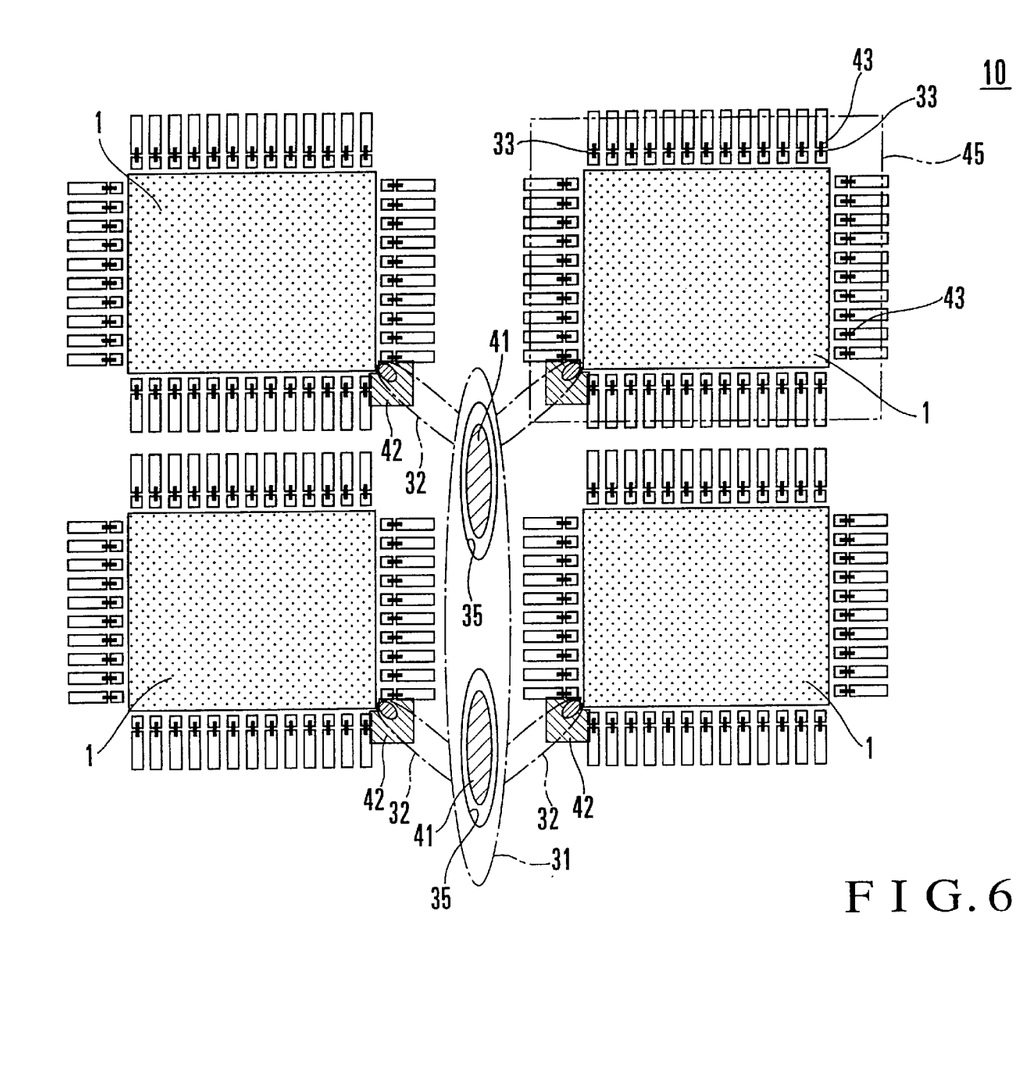
FIG. 6 is a schematic plan view for explaining the semiconductor device manufacturing method according to the present invention.

FIG. 6 shows the relationship among the punches 41, 42, and 43, runner 31, gates 32, and tie bars 33. In FIG. 6, two columns each consisting of three resin-encapsulated semiconductor devices 1 are formed on a lead frame 10. Removal of the runner 31 and gates 32 and cutting and removal of the tie bars 33 are shown in an overlapping manner. After these semiconductor devices formed on the lead frame 10 are subjected to removal of the runner, gates, and tie bars, they are cut each at a position of a frame cutting line 45 indicated as a broken line in the upper right portion of FIG. 6 in the lead molding step, to obtain individual semiconductor devices 1.

Removal of the runners 31, gates 32, and tie bars 33 from the 12 resin-encapsulated semiconductor devices 1 on the lead frame 10 described above is performed in the following manner.

Referring to FIG. 1, the two columns (referred to as one stage) each consisting of the three semiconductor devices 1 of the lead frame 10 are intermittently conveyed from the left the right in FIG. 1, so as to first move to a position corresponding to the runner/gate removing portion 11 on the left half of the press mold (21 and 22). The press mold (21 and 22) is mated to remove the runner 31 and gates 32 with the corresponding punches 41 and 42.

The runner 31 and gates 32 are removed from the lead frame 10 in the above manner. The six resin-encapsulated semiconductor devices 1 located on this lead frame 10 on the upstream since in the convey direction have moved to a position corresponding to the tie bar cutting and removing punch portion 12 on the right half of the press mold (21 and 22). When the press mold (21 and 22) is mated in this state, the tie bar punches 43 and tie bar dies 44 cut the tie bars 33, as shown in FIGS. 2 and 3.

In short, according to the present invention, the runner/gate removing portion 11 and tie bar removing portion 12 formed on the left and right sides, respectively, of the press mold (21 and 22) described above simultaneously remove the runner and gates and cut and remove the tie bars, respectively, of the two stages of semiconductor devices 1 on the lead frame 10 that has been conveyed to the corresponding positions.

Many tie bars 33 are formed around each semiconductor device 1, as described with reference to FIG. 6. The punches 43 and dies 44 described above are provided in number corresponding to the number of tie bars 33 to be cut.

Assuming that the pitch among the columns is P, the lead frame 10 is conveyed to intermittently repeat movement by 2P.

As described above, removal of the runner 31 and gates 32 and cutting and removal of the tie bars 33 are performed for the six semiconductor devices 1 as one stage. When one stage from which the runner 31 and gates 32 described above are removed is located at the tie bar removing portion 12, the following six semiconductor devices 1 on the lead frame 10 correspond to the runner/gate removing portion 11 as the left half of the press mold (21 and 22). When one-stroke mating of the next press mold (21 and 22) is performed, cutting of the tie bars 33 is performed on the right side while removal of the runner 31 and gates 32 is performed on the left side.

In the semiconductor device manufacturing apparatus according to the present invention, when the press mold (21 and 22) described above is mated in one stroke for the resin-encapsulated semiconductor devices 1 aligned on the lead frame 10, the runner 31, gates 32, and tie bars 33 can be removed.

In this embodiment, the punches 41 and 42 provided to the runner/gate removing portion 11 abut against the runner 31 and gates 32 in the initial motion of one stroke of the press mold (21 and 22) to remove them.

Furthermore, the tie bar punches 43 provided to the right-side tie bar removing portion 12 cut and remove the tie bars 33 with a motion of one stroke of the press mold (21 and 22) after the runner and gates are removed. When the tie bars 33 of one stage of (six) semiconductor devices are to be cut, two semiconductor devices each denoted by reference numeral $\hat{1}$, $\hat{2}$, or $\hat{3}$ on the right side in FIG. 1 are handled as one set to remove their tie bars 33 in a stepwise manner.

Removal of the runner and gates with the runner/gate removing portion 11 described above and 3-step cutting and removal of the tie bars with the tie bar removing portion 12 are preferably performed at appropriate timings in one stroke of the press mold. Concerning the order of cutting and removal of the tie bars 33, the arrangement or order of $\hat{1}$, $\hat{2}$, and $\hat{3}$ described above can be changed appropriately.

This can be readily understood from the fact that the tie bar punches 43 in FIGS. 2 and 3 have three different lengths to be different from the lengths of the runner punch 41 and gate punches 42 described above. More specifically, in the press molds 21 and 22 described above, the stroke with which each one of the punches 41, 42, and 43 comes into contact with the removing target (the runner 31, gate 32, and tie bar 33) may be changed by changing the punch length or incorporating a spacer. Then, removal of the runner 31 and gates 32 and removal of the tie bars 33 (including removal of the resin not required by the tie bars) are sequentially performed at different timings.

With this structure, the press mold (21 and 22) constituting the runner/gate/tie-bar removing unit 20 can be arranged with a good balance by distributing the press load in one stroke, and a drive source for the press mold or the like can be made relatively compact. For example, it is confirmed that, if the structure of this embodiment is employed, the press mold conventionally used by the runner/gate removing portion can be used unchanged excluding its upper and lower molds 21 and 22 having punches and the like.

In the method and apparatus (semiconductor device resin-encapsulating apparatus) for manufacturing the resin-encapsulated semiconductor device 1 according to the present invention, cutting of the tie bars 33, which is conventionally performed after trimming and plating, is performed immediately after the resin-encapsulating step is ended and at least before the trimming and plating step. Conventional inconveniences in which the resin scrap, metal scrap, and the like adversely affect the following steps do not occur.

With the method of manufacturing the semiconductor device 1 described above, immediately after resin encapsulation, the runner/gate/tie-bar removing step is performed to remove the runner 31 and gates 32 and to cut and remove the tie bars 33 of the outer lead portions of the lead frame 10, and after that, the trimming and plating step is performed. Trimmed scrap such as resin scrap or metal scrap which is generated when cutting the tie bars 33 can be removed. Therefore, when lead forming, lead cutting, and the like are performed in the following steps, damages as in the prior art do not occur. The quality of the product can be improved, a screening failure can be eliminated, and accordingly the yield can be increased.

In the semiconductor device manufacturing apparatus described above, removal of the runner 31 and gates 32 and cutting and removal of the tie bars 33 (including removal of the resin not required by the tie bars) of the outer lead portions of the lead frame 10, after the resin-encapsulating step are performed by one press mold (21 and 22) in units of a plurality of semiconductor devices 1 aligned on the lead frame 10. The manufacture of the semiconductor devices 1 can be performed efficiently with the necessary and minimum facilities and a small number of steps while enhancing the mass-production effect.

In addition, in the one-stroke motion of the press mold (21 and 22) described above, removal of the runner 31 and gates 32 and cutting of the tie bars 33 described above are sequentially performed at different timings. A drive source for driving the press mold can be minimized and utilized effectively. Then, the mechanism of the conventionally known runner/gate removing portion can be used effectively by only changing the molds.

Since cutting and removal of the tie bars 33 are performed simultaneously with removal of the runner and gates by the runner/gate removing portion of the semiconductor device resin-encapsulating apparatus, trimmed scrap generated during cutting and removal of the tie bars can be removed in the trimming and plating step as the next step in the resin-encapsulating step of the semiconductor device resin-encapsulating apparatus. As a result, trimmed scrap such as resin scrap or metal scrap, that conventionally poses a problem because tie bar removal is conventionally performed in the finishing step after the resin-encapsulating step, is not generated, and the yield of the semiconductor devices can be improved.

With the arrangement described above, the semiconductor device 1, the sectional surfaces of the tie bars 33 of which are solder-plated, can be obtained. Solder plating aims at preventing the metal scrap remained on the sectional surfaces of the tie bars from influencing the following steps, and can thus be replaced with plating of other metals.

Conventionally, cutting of the tie bars 33 is performed after plating, and the resultant screening fraction defective is accordingly about 1.37%. In contrast to this, with the semiconductor device manufacturing method according to the present invention which has the method and arrangement as described above, plating is performed after cutting of the tie bars 33, and the screening fraction defective is improved to 0.39%. This is confirmed by experiments.

The present invention is not limited to the structure explained in the embodiments described above, and the shapes, structures, and the like of the respective portions can be modified and changed as required, as a matter of course.

For example, in the embodiment described above, the number of resin-encapsulated semiconductor devices 1 aligned on the lead frame 10, for which removal of the runners 31, gates 32, and tie bars 33 are to be performed simultaneously after resin encapsulation, may be appropriately changed in accordance with the number of semiconductor devices 1 that can be resin-encapsulated at once.

In the above embodiment, the structure and shape of the resin-encapsulated semiconductor device 1 are described by way of an example. The present invention is not limited to this, but can be freely applied to any resin-encapsulated semiconductor device 1 manufactured by using the lead frame 10, even if it has widely known various types of structures and shapes.

As has been described above, in the semiconductor device according to the present invention, trimming and plating are performed even after cutting of the tie bars is performed after resin encapsulation, so that the sectional surfaces of the tie bars are solder-plated. As compared to the prior art, no portion of the semiconductor device is exposed, and the quality of the product is improved while the yield is improved.

With the semiconductor device manufacturing method according to the present invention, the tie bar removing portion for cutting and removing the tie bars of the outer lead portions is provided in the semiconductor device resin-encapsulating apparatus, of the resin-encapsulated semiconductor device manufacturing apparatus, that performs the resin encapsulating step. The tie bar cutting and removing step which conventionally causes a problem of trimmed scrap in the finishing step after the resin encapsulating step can be eliminated.

Since cutting and removal of the tie bars are performed simultaneously with removal of the runner and gates by the runner/gate removing portion of the semiconductor device resin-encapsulating apparatus, trimmed scrap generated during cutting and removal of the tie bars can be removed in the trimming and plating step as the next step in the resin-encapsulating step of the semiconductor device resin-encapsulating apparatus. As a result, trimmed scrap such as resin scrap or metal scrap, that conventionally poses a problem because tie bar removal is conventionally performed in the finishing step after the resin-encapsulating step, is not generated, and the yield of the semiconductor devices can be improved.

According to the present invention, the removing portion for cutting and removing the tie bars can be formed integrally in the semiconductor device resin-encapsulating apparatus with the removing portion that removes the runner and gates. The number of steps in manufacturing the semiconductor device can be reduced, and the manufacturing method and apparatus can be simplified.

According to the present invention, the runner punch and gate cut punches (runner/gate removing punch portion) for cutting the runner and gates, and the tie bar cut punches (tie bar cutting and removing punch portion) for cutting the tie bars are provided to one press mold. Both removal of the runner and gates and cutting of the tie bars can be performed simultaneously by one stroke of this press mold.

According to the present invention, with the one-stroke motion of the press mold, removal of the runner and gates and cutting of the tie bars described above are sequentially performed at different timings. A drive source for driving the press mold can be minimized and utilized effectively. Then, the mechanism of the conventionally known runner/gate removing portion can be used effectively by only changing the mold.

What is claimed is:

1. A semiconductor device manufacturing apparatus for resin-encapsulating a semiconductor chip mounted on a die pad of a lead frame, said apparatus comprising first and second punch press molds that oppose each other, wherein said first punch press mold comprises a runner/gate removing punch portion and a tie bar cutting and removing punch portion are aligned on said first punch press mold in a convey direction of said lead frame, said first punch press mold including tie bar punches of three different operative lengths extending from said press mold, and said second punch press mold comprises a plurality of equal length dies.

2. A semiconductor device manufacturing apparatus for forming a plurality of semiconductor packages by resin-encapsulating semiconductor chips respectively mounted on a plurality of die pads aligned on a lead frame, said apparatus comprising first and second punch press molds that oppose each other, wherein runner/gate removal and tie bar cutting and removal at outer lead portions of said lead frame of said semiconductor chips, after a resin-encapsulating step, are performed by a single punch press mold, and a runner/gate removing punch portion for performing runner/gate removal and a tie bar cutting and removing punch portion for performing the tie bar cutting and removal for said plurality of semiconductor packages in a stepwise manner are provided to said punch press mold, wherein said first press punch mold includes tie bar punches of three different operative lengths extending from the press mold, and said second punch press mold comprises a plurality of equal length dies.

3. An apparatus according to claim 1, wherein said runner/gate removal punches have longer operative lengths than said tie bar cutting punches, said tie bar removing punch portion in the stepwise manner are sequentially performed at different timings in one stroke.

4. An apparatus according to claim 2, wherein said runner/gate removal punches have longer operative lengths than said tie bar cutting punches.

* * * * *